(12) United States Patent
Kokubun (10) Patent No.: US 6,413,808 B1
(45) Date of Patent: Jul. 2, 2002

(54) SEMICONDUCTOR DEVICE AND PROCESS FOR PRODUCTION THEREOF

(75) Inventor: Tetsuya Kokubun, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/618,104

(22) Filed: Jul. 17, 2000

(30) Foreign Application Priority Data

Jul. 22, 1999 (JP) .......................................... 11-207451

(51) Int. Cl.[7] .......................................... H01L 21/8238
(52) U.S. Cl. ........................ 438/200; 438/199; 438/305; 257/355; 257/356; 257/369
(58) Field of Search ................................ 438/200, 202, 438/234, 305, 210, 199; 257/360, 355, 369, 297, 356

(56) References Cited

U.S. PATENT DOCUMENTS 5,521,415 A  *  5/1996  Kondo ........................ 257/357

FOREIGN PATENT DOCUMENTS

| JP | 58-201353 | | 11/1983 |
|---|---|---|---|
| JP | 62-239567 | | 10/1987 |
| JP | 63-219152 | * | 9/1988 |
| JP | 1-130561 | | 5/1989 |
| JP | 1-169049 | | 11/1989 |
| JP | 3-159270 | | 7/1991 |
| JP | 4-3920 | | 1/1992 |
| JP | 4-324973 | | 11/1992 |
| JP | 6-105774 | | 12/1994 |
| JP | 8-8308 | | 1/1996 |
| JP | 9-321150 | | 12/1997 |
| JP | 10-41469 | | 2/1998 |
| JP | 10-65020 | | 3/1998 |
| JP | 10-135351 | | 5/1998 |

* cited by examiner

Primary Examiner—Charles Bowers
Assistant Examiner—Hsien-Ming Lee
(74) Attorney, Agent, or Firm—McGinn & Gibb, PLLC (57) ABSTRACT

In the semiconductor device disclosed in the present invention, the well regions in the internal circuit comprise high-impurity-concentration regions 4 and 5 as lower layers and low-impurity-concentration regions 2 and 3 as upper layers, and the well regions in the I/O-protective circuit comprise only low-impurity-concentration regions 11 and 12. As a result, there can be realized an internal circuit having good latch-up resistance and an I/O-protective circuit having good static surge resistance.

7 Claims, 4 Drawing Sheets

SEMICONDUCTOR DEVICE AND PROCESS FOR PRODUCTION THEREOF

TECHNICAL FIELD

The present invention relates to a semiconductor device having an internal circuit endowed with latch-up resistance and an I/O-protective circuit endowed with electrostatic surge destruction (ESD) resistance.

BACKGROUND ART

Complementary MOS transistor (CMOS) is constituted by combining p-MOS and n-MOS and has been used most widely among various transistors for advantages such as low power consumption, operation even at a low voltage, and the like. In recent years, semiconductor devices having CMOS mounted thereon have come to be used even in severe environments such as space and the like, where the semiconductor devices are exposed to a radiation. When conventional CMOS type semiconductors are used in an environment where a radiation is present, however, there has been a problem in that they malfunction owing to the incidence of charged particles. This malfunction occurs because the charges generated along the track of the charged particles are gathered in the diffused layer according to a mechanism such as funneling or the like, and is called a single-event phenomenon. As the single-event phenomenon, there are, for example, a single-event upset phenomenon in which the gathered charges alter the potential of the node connected to the drain, giving rise to bit reversion; and a single-event latch-up phenomenon which is induced by change of the gathered charges into a trigger current.

Conventional CMOS type semiconductor devices are used by applying a positive voltage to the n-well regions to allow each pn junction between n-well and p-well to be in a reverse bias state. When charged particles pass through the n-well regions of the CMOS transistor, electron-hole pairs appear along the track of the charged particles. At this time, the electrons in the depletion layer are gathered in the n-well regions by drifting and the electrons in the substrate region are gathered also in the n-well regions by diffusion. Further, at the bottom of each n-well region which is in a reverse bias state, the depletion layer is converted into a conducting state by the generated charges, and the electric field which has been applied to the depletion layer, extends towards the p-substrate of low impurity concentration, in a columnar shape. The electrons in this extended electric field region (funneling region) are as well gathered in the n-well regions by drifting. The thus-gathered electrons flow through the n-well regions in a current pulse and become a trigger for latch-up appearance. In this way, single-event latch-up appears.

As an example of the known techniques for suppressing the appearance of latch-up, there is, as disclosed in, for example, JP-A-58-201353, a technique of forming, at the lower part of each well region formed on the principal side of a semiconductor substrate, a high-impurity-concentration region having the same conduction type as the well region. By forming the high-impurity-concentration region, the parasitic transistor formed in each well region is allowed to have a substantially lateral structure, the current amplification ratio is made small, and the appearance of latch-up is suppressed. Further, a technique of forming a high-impurity-concentration region at the lower part of each well region by ion implantation, i.e. a technique of producing a retrograde well, is disclosed in, for example, JP-A-1-130561 and JP-A-4-3920.

Figure 4:
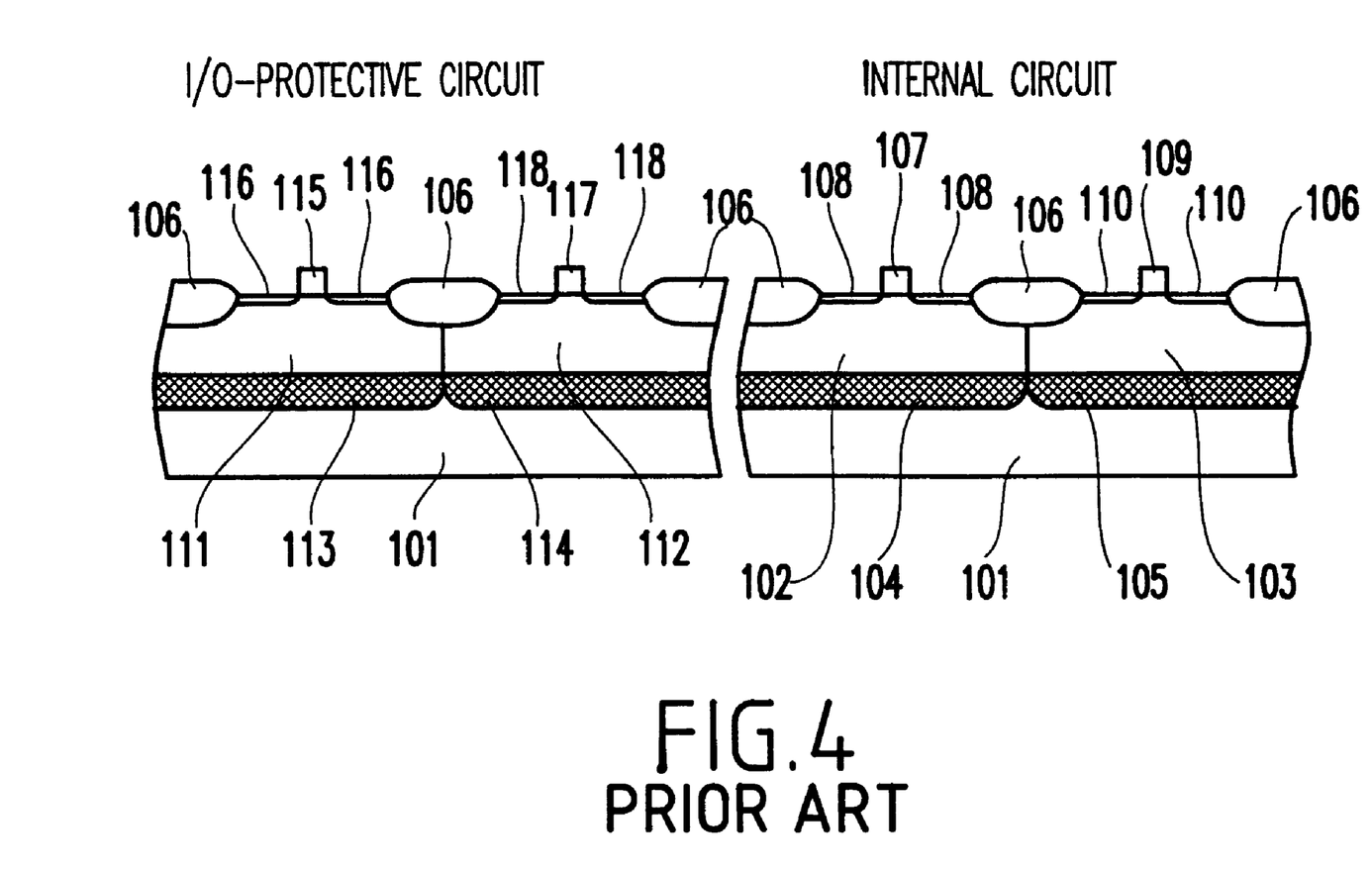
FIG. 4 is a schematic sectional drawing for explaining a conventional semiconductor device.

In semiconductor devices having, in particular, a twin-well CMOS structure, there is generally employed, as shown in FIG. 4 (prior art), a structure in which both the n-well regions and the p-well regions are retrograde wells. The left side of FIG. 4 is an I/O-protective circuit and the right side is an internal circuit. They are indicated in a separated state but show part of a semiconductor chip. Description is first made on the internal circuit portion. On a p-silicon substrate 101 are formed an n-well region 102 and a p-well region 103. In the internal circuit are also provided an $n^+$-well region 104 of high impurity concentration at the lower part of the n-well region 102, and a $p^+$-well region 105 of high impurity concentration at the lower part of the p-well region 103. On a substrate is formed an element-isolating insulating film 106. On the n-well region 102 is formed a p-channel type MOS transistor consisting of a gate electrode 107 and a $p^{++}$-region 108; on the p-well region 103 is formed an n-channel type MOS transistor consisting of a gate electrode 109 and an $n^{++}$-region 110. At the bottom of each gate electrode is present a gate oxide film which is not shown in FIG. 4.

Next, description is made on the I/O-protective circuit. On the semiconductor substrate 101 are formed an n-well region 111 and a p-well region 112. Similarly to the case of the internal circuit, an $n^+$-well region 113 of high impurity concentration is provided at the lower part of the n-well region 111, and a $p^+$-well region 114 of high impurity concentration is provided at the lower part of the p-well region 112. On the substrate is formed an element-isolating insulating film 106. On the n-well region 111 is formed a p-channel type MOS transistor consisting of a gate electrode 115 and a $p^{++}$-region 116; on the p-well region 112 is formed an n-channel type MOS transistor consisting of a gate electrode 117 and an $n^{++}$-region 118. At the bottom of each gate electrode is present a gate oxide film which is not shown in FIG. 4.

By employing such a retrograde well structure, the latch-up resistance of CMOS semiconductor device has heretofore been improved.

In conventional semiconductor devices, an I/O-protective circuit has been provided in order to protect the internal circuit from the surge current (voltage) applied to I/O terminals. That is, it has been attempted to protect the internal circuit of conventional semiconductor device from ESD and latch-up caused by the current noise sent from I/O terminals, by allowing the device to have an I/O-protective circuit. However, when a high-impurity-concentration region is formed at the lower part of each well region of I/O-protective circuit, there appears a problem that the latch-up resistance increases but the ESD resistance decreases. This is due to the following reasons.

Firstly, when there is a high-impurity-concentration region at the lower part of each well region of I/O-protective circuit, the current amplification ratio of parasitic bipolar transistor decreases; as a result, the bypassing ability of the ESD current applied from I/O terminals decreases, resulting in reduced ESD resistance.

Secondly, the resistance to shunt the current between the emitter and base of parasitic bipolar transistor, i.e. shunt resistance decreases; as a result, the current injected for operation of lateral bipolar transistor increases and the speed of response becomes low. Therefore, when an electrostatic pulse has been applied, the I/O-protective circuit is unable to make instantaneous response.

Thirdly, the snap-back voltage increases; as a result, the Joule heat generated increases and the thermal breakdown of device occurs easily.

In conventional CMOS semiconductor devices, each n-well region and each n⁺-well region are formed in one lithography step, and each p-well region and each p⁺-well region are formed in one lithography step. Therefore, as shown in FIG. 4, a high-impurity-concentration region is present in each well region constituting the internal circuit and I/O-protective circuit of semiconductor chip. As a result, the ESD resistance of the I/O-protective circuit has been insufficient and the I/O-protective circuit has not functioned satisfactorily.

When a semiconductor device having CMOS mounted thereon is used particularly in an environment where a radiation is present, such as space or the like, the internal circuit of the device is required to have single-event latch-up resistance. Consequently, each well region in the internal circuit must comprise a high-impurity-concentration region. Meanwhile, a CMOS semiconductor device must have an I/O-protective circuit regardless of in what kind of environment the device is used, in order to protect the internal circuit from ESD and latch-up caused by the current noise sent from I/O terminals; and this I/O-protective circuit must have ESD resistance. Thus, when a semiconductor device having thereon an internal circuit and an I/O-protective circuit both constituted by CMOS is used in an environment where a radiation is present, such as space or the like, both of good latch-up resistance of internal circuit and good ESD resistance of I/O-protective circuit have been desired strongly.

DISCLOSURE OF THE INVENTION

In order to realize the above desire, the gist of the present invention lies in a semiconductor device having:

an internal circuit having a CMOS comprising a first well region and a second well region both having different conduction types and formed on a semiconductor substrate and each one transistor formed at the first well region and the second well region, and an I/O-protective circuit having a CMOS comprising a third well region and a fourth well region both having different conduction types and formed on the semiconductor substrate and each one transistor formed at the third well region and the fourth well region, in which semiconductor device each of the first well region and the second well region comprises a low-impurity-concentration region and a high-impurity-concentration region formed beneath the low-impurity-concentration region, having the same conduction type as the low-impurity-concentration region, and each of the third well region and the fourth well region comprises a low-impurity-concentration region.

The gist of the present invention lies also in a process for producing a semiconductor device, which comprises:

(a) a step of forming, on a semiconductor substrate, a first photoresist having openings at particular areas, (b) a step of conducting ion implantation using the first photoresist as a mask, to form a first low-impurity-concentration region as part of an internal circuit to be completed later and a second low-impurity-concentration region as part of an I/O-protective circuit to be completed later, (c) a step of forming a second photoresist having an opening only above the first low-impurity-concentration region, and (d) a step of conducting ion implantation using the second photoresist as a mask, to form, at the lower part of the first low-impurity-concentration region, a high-impurity-concentration region having the same conduction type as the first low-impurity-concentration region.

In the semiconductor device of the present invention, a high-impurity-concentration region is formed at the lower part of each well region of the internal circuit, but no high-impurity-concentration region is formed at any well region of the I/O-protective circuit; as a result, both of good latch-up resistance and good ESD resistance are achieved. Further, the semiconductor device of the present invention is endowed with single-event latch-up resistance at the internal circuit and, therefore, can be suitably used in an environment where a radiation is present.

Furthermore, in the process of the present invention for production of semiconductor device, photolithography is conducted twice, which enables selective formation of high-impurity-concentration region at the lower parts of particular well regions. As a result, the semiconductor device of the present invention can be produced inexpensively at a high yield.

BEST MODE FOR CARRYING OUT THE INVENTION

In the semiconductor device of the present invention, each well region of the internal circuit has a high-impurity-concentration region at the lower part but each well region of the I/O-protective circuit has no high-impurity-concentration region; the impurity concentration in each well region of the I/O-protective circuit is lower than the impurity concentration in each high-impurity-concentration region of the internal circuit.

Further, the impurity concentration in each low-impurity-concentration region of the first, second, third and fourth well regions is lower than the impurity concentration in any of the high-impurity-concentration regions of the first and second well regions.

In the semiconductor device having the above-mentioned features, both of good latch-up resistance and good ESD resistance can be secured for the reasons mentioned below.

That is, in the semiconductor device of the present invention, a high-impurity-concentration region is formed at the lower part of each well region of the internal circuit; therefore, the base transport efficiency of parasitic bipolar transistor is low and the current amplification ratio is low. Further, the shunt resistance of parasitic bipolar transistor is small. Consequently, the threshold current causing latch-up and the holding current necessary for holding latch-up are large, resulting in improved latch-up resistance.

Also, since each well region of the I/O-protective circuit has no high-impurity-concentration region, there is neither decrease in the current amplification ratio of parasitic bipolar transistor nor decrease in the bypassing ability of the ESD current from I/O terminals. Further, since there is no decrease in shunt resistance, the response speed of parasitic bipolar transistor is high. Furthermore, since the snap-back voltage is suppressed low, the amount of Joule heat generated is small. By these functions, reduction in the ESD withstand of the I/O-protective circuit can be prevented.

It is desirable that each low-impurity-concentration region is formed at a depth from the substrate surface, of up to about 1.2 µm in the internal circuit and at a depth from the substrate surface, of up to about 2.4 µm in the I/O-protective circuit.

It is also desirable that each high-impurity-concentration region is formed at a depth from the substrate surface, of up to about 0.5 to 2.4 µm.

The impurity concentration may have a peak or may be substantially constant in the depth direction, or may increase gradually as the depth becomes larger. There is no particular restriction as to the impurity concentration, and the impurity concentration may have a complex distribution.

The impurity region formed by one time of ion implantation, generally has a peak of concentration. A region of substantially constant impurity concentration can be formed by conducting ion implantation several times with the dose being kept constant and the acceleration energy of ion beam being altered and further conducting a heat treatment as necessary. Also, a region of complex impurity concentration distribution can be formed by conducting ion implantation with the dose and the acceleration energy both being altered.

The impurity concentration in each low-impurity-concentration region is expressed as an average impurity concentration. In calculation of the average impurity concentration, however, the impurity concentration of diffused layer is excluded. The impurity concentration in each high-impurity-concentration region is expressed as the maximum impurity concentration.

Figure 1A:
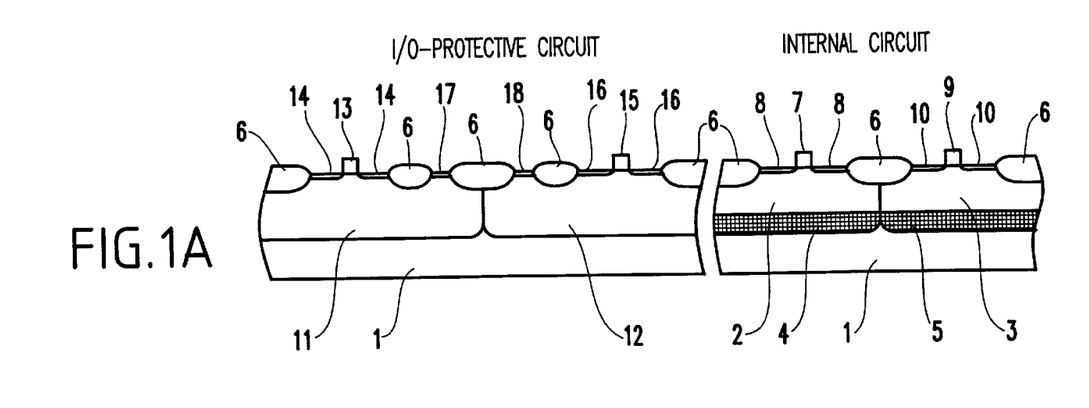
FIGS. 1(a)–1(c) are schematic sectional drawings for explaining the semiconductor device of the present invention.
Figure 1B:
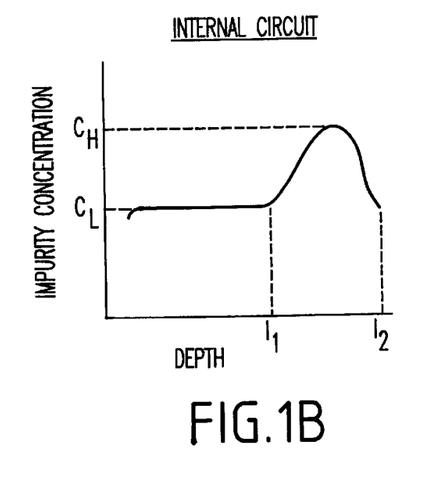
Figure 1C:
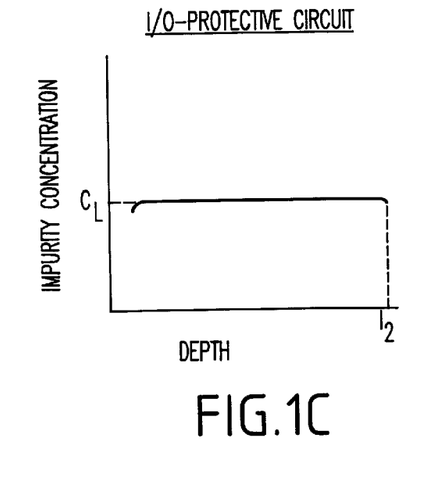

Further description is made on the impurities of well regions referring to the case of FIGS. 1(b) and 1(c). FIGS. 1(b) and 1(c) each show the dependency of impurity concentration on depth. In this case, the impurity concentration in low-impurity-concentration region is made constant at $C_L$. The impurity concentration in each high-impurity-concentration region formed at the lower part (ranging between $l_1$ and $l_2$) of each well region of the internal circuit is $C_H$. The impurity concentration in each high-impurity-concentration region is not made constant.

The impurity concentration in each high-impurity-concentration region of the first well region and the second well region is preferably between $2.0 \times 10^{17}$ atoms/cm$^3$ and $2.0 \times 10^{18}$ atoms/cm$^3$; the impurity concentration in each low-impurity-concentration region of the first well region, the second well region, the third well region and the fourth well region is preferably between $1.0 \times 10^{17}$ atoms/cm$^3$ and $1.0 \times 10^{18}$ atoms/cm$^3$; and the ratio of the impurity concentration in each high-impurity-concentration region of the first well region and the second well region, to the impurity concentration in each low-impurity-concentration region of the third well region and the fourth well region is preferably between 1.2 and 10.0.

The ratio of the impurity concentration in each high-impurity-concentration region of the first well region and the second well region, to the impurity concentration in each low-impurity-concentration region of the third well region and the fourth well region is more preferably between 1.5 and 8.0.

By controlling the ranges of impurity concentrations as above, there can be realized good latch-up resistance, good ESD resistance, good device properties and good device productivity.

When the impurity concentration in each high-impurity-concentration region is too low, the single-event latch-up resistance of the resulting device is insufficient; when said concentration is too high, production of device is difficult. When the impurity concentration in each low-impurity-concentration region is too low, the operation of the resulting device is insufficient; when said concentration is too high, the junction capacitance at each bottom of the source and drain regions of each MOS transistor increases, inviting the deterioration of operational speed of device.

Also, when the impurity concentration in each low-impurity-concentration region is too high, the ESD resistance of the I/O-protective circuit is insufficient.

Further, when the ratio of the impurity concentration in each high-impurity-concentration region, to the impurity concentration in each low-impurity-concentration region is too small, neither latch-up resistance nor ESD resistance is realized; when said ratio is too large, production of device is difficult.

Incidentally, the impurity concentrations in the low-impurity-concentration regions of the first, second, third and fourth well regions may all be the same. In this case, the well regions of same conduction type can be formed by the same step, making strikingly simple the process for device production.

The thickness of each low-impurity-concentration region is preferably 0.3 to 1.2 µm, and the thickness of each high-impurity-concentration region is preferably 0.3 to 1.2 µm.

As long as the thickness of each impurity region is within the above range, sufficient device properties and sufficient latch-up resistance can be realized and a good device can be produced.

Incidentally, the thickness and impurity concentration of each impurity region can be measured by, for example, secondary ion mass spectrometry (SIMS).

Control of latch-up can basically be obtained by reducing the resistance of each well region. The requirement for high integration for the I/O-protective circuit, as compared with that for the internal circuit, is low and there is large areal room in constitution of the I/O-protective circuit. Therefore, in order to suppress the appearance of latch-up caused by the current noise from I/O terminals, it is preferred to form, on each well region of the I/O-protective circuit, a diffused layer of the same conduction type as the well region.

This diffused layer is ordinarily arranged so as to surround each transistor of the I/O-protective circuit and is fixed at the same potential as the well region beneath the diffused layer. By forming this diffused layer, the charges of the surge current injected into the well from I/O terminals are drawn into the diffused layer, whereby the latch-up attributed to the thyristor structure of CMOS is suppressed. As long as the diffused layer has such an effect and can suppress the latch-up, the diffused layer has no particular restriction as to the impurity concentration or the like.

That is, it is preferred that there is formed, on the third well region, a diffused layer having the same conduction type as the third well region and that there is formed, on the fourth well region, a diffused layer having the same conduction type as the fourth well region. By thus allowing the I/O-protective circuit to have sufficient latch-up withstand, the I/O-protective circuit does not generate latch-up even when charged with the charged particles of a radiation or the like.

Next, description is made on the process for producing a semiconductor device according to the present invention.

In conventional processes for producing a semiconductor device, the well regions of the internal circuit and the I/O-protective circuit are formed simultaneously by one time of photolithography; therefore, it has been difficult to form, in each circuit, well regions having different impurity concentration distributions.

Meanwhile, in the production process disclosed in the present invention, photolithography is conducted two times. In the first photolithography, the first photoresist applied is allowed to have openings above all the areas where the well regions of internal circuit and I/O-protective circuit are to be formed; in the second photolithography, the second photoresist applied is allowed to have openings only above the areas where the well regions of internal circuit are to be formed. By using such a production process, high-impurity-concentration regions can be formed selectively only at the lower parts of the well regions of internal circuit.

As a result, a semiconductor device having both of good latch-up resistance and good ESD resistance can be produced at a high yield.

The well regions of the semiconductor device of the present invention can be formed by ion implantation, because the method enables accurate control of impurity concentration and can add an impurity position—selectively using a photoresist as a mask. The ion implantation includes a low-speed method using an ion beam energy of several tens of keV and a high-speed method using an ion beam energy of several hundreds of keV. A high-speed method is used when relatively deep well regions such as seen in the present invention are formed.

A preferred energy range is 100 to 1000 keV. When the energy used is smaller than 100 keV, the well regions formed are too shallow; when the energy is larger than 1000 keV, the well regions formed are too deep.

A preferred dose range is $0.5 \times 10^{13}$ atoms/cm$^2$ to $5 \times 10^{13}$ atoms/cm$^2$ in the step (b), and $1 \times 10^{13}$ atoms/cm$^2$ to $1 \times 10^{14}$ atoms/cm$^2$ in the step (d). When the dose is lower than the preferred range, the impurity concentration in each well region formed is too low; when the dose is higher than the preferred range, the impurity concentration in each well region formed is too high.

It is possible to form an impurity region wherein the impurity concentration is made substantially constant in the depth direction, by conducting ion implantation several times with the dose being kept constant but the energy being altered. In an impurity region formed by one time of ion implantation, the dependency of the impurity concentration on the depth direction is generally a Gaussian distribution and the impurity concentration often has a peak at a certain depth. However, by conducting ion implantation several times to form an impurity region having a plurality of peaks at different depths, it is possible to form an impurity region having an impurity concentration substantially constant in the depth direction, such as shown in FIG. 1(c).

Also, by conducting ion implantation several times with the dose and the energy both being altered, it is possible to form an impurity region of complicated concentration distribution, for example, an impurity region wherein the impurity concentration increases gradually as the depth increases. After the ion implantation, a heat treatment such as annealing or the like is conducted as necessary, in some cases.

In the present invention, the second photoresist may be laminated on the first photoresist without removing the first photoresist. With such operation, the present process becomes simpler, the production cost decreases, and the product yield increases. Specific effects of such operation are mentioned in Example 3.

The semiconductor device of the present invention is suitably mounted on electronic parts used in an environment where a radiation is present, such as space or the like. The reason is that since the device has a high-impurity-concentration region in each well region of the internal circuit, particularly the single-event latch-up caused by the incidence of charged particles can be suppressed effectively.

High-energy charged particles are flying in space. When these charged particles hit upon a semiconductor device, the particles reach the innermost part of the semiconductor substrate, generating a noise current and causing single-event latch-up.

In the present invention, a high-impurity-concentration region is formed at the lower part of each well region of the internal circuit; thereby, generation of single-event latch-up is prevented thereby even when charged particles reach as far as the innermost part of the semiconductor substrate. Further, single-event upset as another single event caused by the incidence of charged particles is also suppressed effectively by the above-mentioned high-impurity-concentration region.

Thus, there is provided, by the present invention, a semiconductor device usable in an environment where a radiation is present. Incidentally, as examples of the environment where a radiation is present, there can be mentioned space, stratosphere, ozone hole and the control areas of nuclear facilities.

The present invention is described in more detail below by way of Examples.

EXAMPLE 1

The semiconductor device of the present invention is illustrated in FIG. 1(a). The left side of FIG. 1(a) is the I/O-protective circuit, and the right side is the internal circuit. They are indicated in a separated state but show part of a semiconductor chip. Description is made first on the internal circuit. On a p-silicon substrate 1 are formed an n-well region 2 and a p-well region 3. In the internal circuit are also provided an n$^+$-well region 4 of high impurity concentration at the lower part of the n-well region 2, and a p$^+$-well region 5 of high impurity concentration at the lower part of the p-well region 3. On a substrate is formed an element-isolating insulating film 6. On the n-well region 2 is formed a p-channel type MOS transistor consisting of a gate electrode 7 and a p$^{++}$-region 8; on the p-well region 3 is formed an n-channel type MOS transistor consisting of a gate electrode 9 and an n$^{++}$-region 10. At the bottom of each gate electrode is present a gate oxide film which is not shown in FIG. 1.

Next, description is made on the I/O-protective circuit. On the semiconductor substrate 1 are formed an n-well region 11 and a p-well region 12. On the substrate is formed an element-isolating insulating film 6. On the n-well region 11 is formed a p-channel type MOS transistor consisting of a gate electrode 13 and a p$^{++}$-region 14; on the p-well region 12 is formed an n-channel type MOS transistor consisting of a gate electrode 15 and an n$^{++}$-region 16. At the bottom of each gate electrode is present a gate oxide film which is not shown in FIG. 1. In the I/O-protective circuit are provided an n$^{++}$-region 17 and a p$^{++}$-region 18 each as a diffused layer for latch-up prevention.

Each high-impurity-concentration region is formed at a depth range of 0.5 to 1.2 μm from the substrate surface. With respect to the impurity concentration in the internal circuit, the phosphorus concentration in the n⁺-well region 4 is $6.0 \times 10^{17}$ atoms/cm³ and the boron concentration in the p⁺-well region 5 is $1.0 \times 10^{18}$ atoms/cm³. In the I/O-protective circuit, the phosphorus concentration in the n-well region 11 is $3.0 \times 10^{17}$ atoms/cm³ and the boron concentration in the p⁺-well region 12 is $5.0 \times 10^{17}$ atoms/cm³. The dependency of the impurity concentration in each well region of the internal circuit or the I/O-protective circuit, on the well depth is shown in FIG. 1(b) or FIG. 1(c). In both the internal circuit and the I/O-protective circuit, each well region is formed to a total depth $l_2$. The impurity concentration in each diffused layer is not shown. In FIG. 1(b) and FIG. 1(c), the impurity concentration in each low-impurity-concentration region is substantially constant in the depth direction; however, the present invention is not restricted thereto.

The internal circuit of the present semiconductor device has sufficient single-event latch-up resistance even in an environment where a radiation is present, and is suitably usable in severe conditions of space, etc. Further, the I/O-protective circuit has sufficient ESD resistance and effectively protects the internal circuit from ESD current.

EXAMPLE 2

Figure 2A:
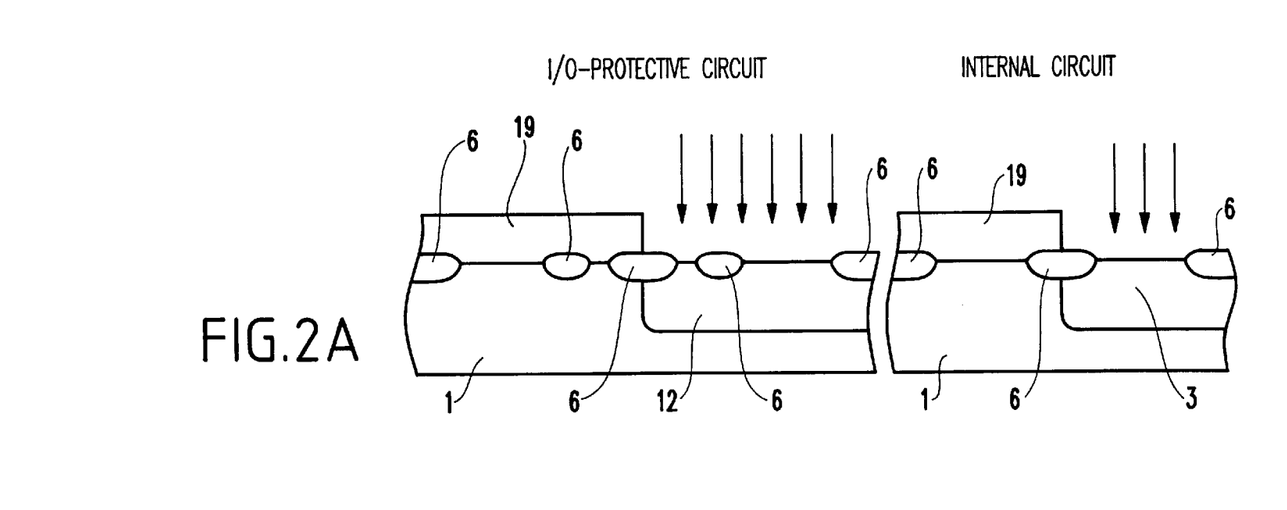
FIGS. 2(a)–2(b) and FIGS. 3(a)–3(b) are sectional drawings for explaining the steps of the process of the present invention for producing a semiconductor device.

Next, description is made on the process for producing the semiconductor device shown in Example 1, with reference to FIG. 2. First, an element-isolating insulating film 6 is formed on a p-silicon substrate 1. Successively, as shown in FIG. 2(a), there is formed a photoresist 19 having openings above areas where n-wells 3 and 12 are to be formed. In this state, ion (boron) implantation is conducted to form p-wells 3 and 12. In this case, by conducting a plurality of times of ion implantations different in energy and dose, there can be realized, by one photolithography step, formation of each well region where the impurity concentration is constant or increases as the depth increases, formation of channel stopper and punch-through stopper, control of threshold voltage, etc.

Figure 2B:
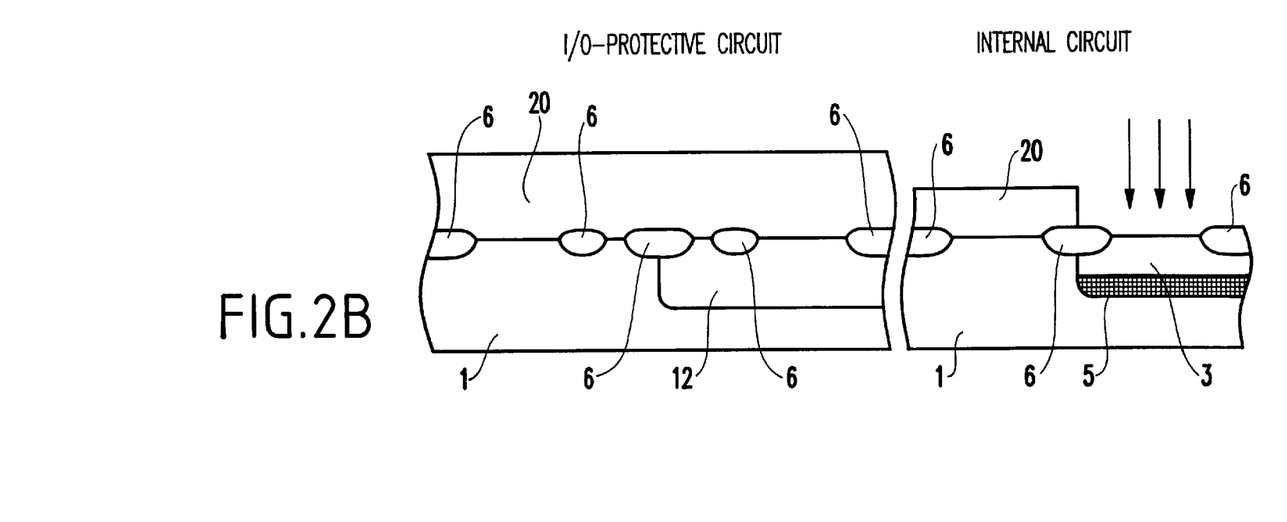

Next, the photoresist 19 is removed and then, as shown in FIG. 2(b), there is formed a photoresist 20 having an opening only above the p-well region 3 of the internal circuit. In this state, ion (boron) implantation is conducted to form a p⁺-well region 5 of high impurity concentration at the bottom part of the p-well region 3.

In the state of FIG. 2(a), boron implantation is conducted several times at an energy ranging from 100 to 300 keV at a dose of $2.0 \times 10^{13}$ atoms/cm²; further, in the state of FIG. 2(b), boron implantation is conducted at an energy of 300 keV at a dose of $3.0 \times 10^{13}$ atoms/cm²; thereby can be obtained a p⁺-well region 5 of high impurity concentration and a p-well region 12 of low impurity concentration which were mentioned in the explanation of FIG. 1.

Similarly, two photolithography steps and ion implantation steps are conducted to form n-well regions 2 and 11 and an n⁺-well region 4 all shown in FIG. 1. Thereafter, each gate oxide film, each gate electrode, a p⁺⁺-region, an n⁺⁺-region, etc. are formed according to an ordinary method, whereby a semiconductor device of FIG. 1 is obtained.

The semiconductor device produced by this process is superior in both of latch-up resistance and ESD resistance; and the process is simple and, therefore, gives a low production cost and a high yield.

EXAMPLE 3

Figure 3A:
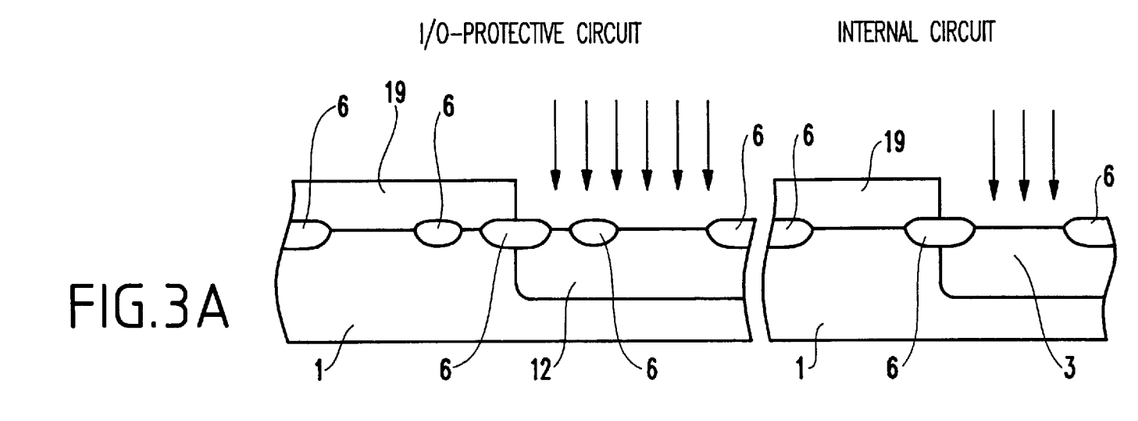

FIG. 3 shows another process for producing the semiconductor device of FIG. 1. First, an element-isolating insulating film 6 is formed on a p-silicon substrate 1. Successively, as shown in FIG. 3(a), there is formed a photoresist 19 having openings above areas where p-well regions 3 and 12 are to be formed. In this state, ion (boron) implantation is conducted to form p-well regions 3 and 12. The steps up to this stage are the same as in Example 2.

Figure 3B:
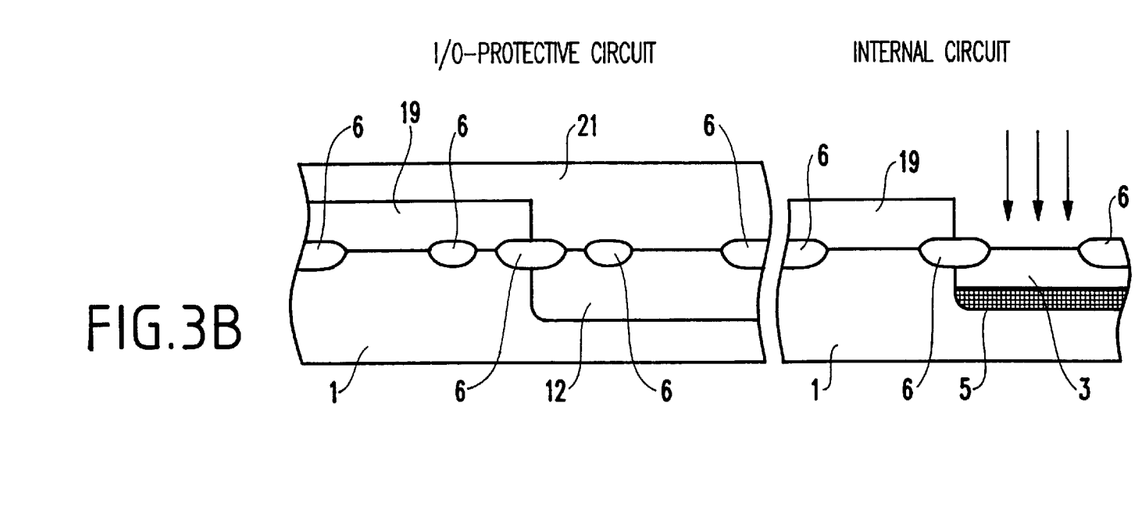

Next, a photoresist is coated on the whole surface without removing the photoresist 19. Successively, photolithography is conducted to form a photoresist 21 so as to cover only an area which is to later become an I/O-protective circuit, as shown in FIG. 3(b). In this state, ion (boron) implantation is conducted to form a p⁺-well region 5 of high impurity concentration at the bottom part of the p-well region 3. Similarly, two photolithography steps and ion implantation steps are conducted to form n-well regions 2 and 11 and an n⁺-well region 4 all shown in FIG. 1. Thereafter, each gate oxide film, each gate electrode, a p⁺⁺-region, an n⁺⁺-region, etc. are formed according to an ordinary method, whereby a semiconductor device of FIG. 1 is obtained.

When this process is used, the following advantages are obtained in addition to those of Example 2.

Firstly, in FIG. 3, the ion implantation for forming the p-well region 3 and the ion implantation for forming the p⁺-well region 5 can be conducted using the same photoresist 19 as a mask. Thereby, the variation of the impurity profile in lateral direction, caused by mismatching in photolithography can be made small. Since the variation of the impurity profile in lateral direction results in the variation of the current amplification ratio of lateral parasitic bipolar transistor, the small variation of lateral impurity profile can make small the variation of latch-up resistance.

Secondly, the mask (reticle) for forming the photoresist 21 of FIG. 3(b) can be allowed to have a simple structure covering only an area which is to later become an I/O-protective circuit. Therefore, the same mask can be used in forming the n⁺-well region and the p⁺-well region. Further, when the positional relationship between I/O-protective circuit and internal circuit is fixed as in gate arrays or embedded arrays, the mask for forming the photoresist 21 need not be changed each time when a different product is produced.

What is claimed is:

1. A semiconductor device, comprising:
    a CMOS internal circuit including a first well region and a second well region of different conduction types, the first well region and the second well region being formed on a semiconductor substrate, and a transistor being formed on each of the first well region and the second well region, and
    a CMOS I/O protective circuit including a third well region and a fourth well region of different conduction types, the third well region and the fourth well region being formed on the semiconductor substrate, and a transistor being formed on each of the third well region and the fourth well region, wherein
        each of the first well region and the second well region further comprises two regions including a low-impurity-concentration region and a high-impurity-concentration region, the high-impurity-concentration region being formed beneath the low-impurity-concentration region and having the same conduction type as the low-impurity-concentration region, and
        each of the third well region and the fourth well region comprises a single low-impurity-concentration region having an impurity concentration that is lower than each of the high-impurity concentration regions of the first well region and the second well region.

2. A semiconductor device according to claim 1, wherein an impurity concentration in each high-impurity-concentration region of the first well region and the second well region is between $2.0 \times 10^{17}$ atoms/cm$^3$ and $2.0 \times 10^{18}$ atoms/cm$^3$, an impurity concentration in each low-impurity-concentration region of the first well region, the second well region, the third well region and the fourth well region is between $1.0 \times 10^{17}$ atoms/cm$^3$ and $1.0 \times 10^{18}$ atoms/cm$^3$, and a ratio of the impurity concentration in each high-impurity-concentration region of the first well region and the second well region, to the impurity concentration in each low-impurity-concentration region of the third well region and the fourth well region is between 1.2 and 10.0.

3. A semiconductor device according to claim 1, wherein the third well region has thereon a diffused layer having the same conduction type as the third well region, and the fourth well region has thereon a diffused layer having the same conduction type as the fourth well region.

4. A semiconductor device according to claim 1, wherein each high-impurity-concentration region of the internal circuit suppresses latch-up in an environment where radiation is present.

5. A process for producing a semiconductor device, comprising:

forming, on a semiconductor substrate, a first photoresist having openings at predetermined areas, conducting ion implantation using the first photoresist as a mask, to form a first low-impurity-concentration region as part of an internal circuit and a second low-impurity-concentration region as part of an I/O-protective circuit, forming a second photoresist having an opening only above the first low-impurity-concentration region, and conducting ion implantation using the second photoresist as a mask, to form, at the lower part of the first low-impurity-concentration region, a high-impurity-concentration region of the same conduction type as the first low-impurity-concentration region, wherein an impurity concentration of the second low-impurity-concentration region is lower than an impurity concentration of the high-impurity-concentration region.

6. A process for producing a semiconductor device according to claim 5, wherein the second photoresist is laminated on the first photoresist without removing the first photoresist.

7. The process for producing a semiconductor device, according to claim 5, wherein a low-impurity concentration of the first low-impurity-concentration region and the second low-impurity-concentration region is between $1.0 \times 10^{17}$ atoms/cm$^3$ and $1.0 \times 10^{18}$ atoms/cm$^3$, a high-impurity concentration of the high-impurity-concentration region is between $2.0 \times 10^{17}$ atoms/cm$^3$ and $2.0 \times 10^{18}$ atoms/cm$^3$, and a ratio of the high-impurity-concentration region to the low-impurity-concentration region is between 1.2 and 10.0.

* * * * *